(12) United States Patent
Fujiwara et al.

(10) Patent No.: US 11,948,627 B2
(45) Date of Patent: Apr. 2, 2024

(54) STATIC RANDOM ACCESS MEMORY WITH WRITE ASSIST CIRCUIT

(71) Applicant: Taiwan Semiconductor Manufacturing Co., Ltd., Hsinchu (TW)

(72) Inventors: Hidehiro Fujiwara, Hsinchu (TW); Chih-Yu Lin, Taichung (TW); Sahil Preet Singh, Hsinchu (TW); Hsien-Yu Pan, Hsinchu (TW); Yen-Huei Chen, Hsinchu (TW); Hung-Jen Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/818,386

(22) Filed: Aug. 9, 2022

(65) Prior Publication Data

US 2022/0383947 A1 Dec. 1, 2022

Related U.S. Application Data

(63) Continuation of application No. 16/983,749, filed on Aug. 3, 2020, now Pat. No. 11,423,977, which is a
(Continued)

(51) Int. Cl.
*G11C 11/419* (2006.01)
*G11C 5/14* (2006.01)
(Continued)

(52) U.S. Cl.
CPC ............ *G11C 11/419* (2013.01); *G11C 5/147* (2013.01); *G11C 7/12* (2013.01); *G11C 11/412* (2013.01);
(Continued)

(58) Field of Classification Search
CPC ............ G11C 7/12; G11C 5/147; G11C 11/41; G11C 11/412; G11C 11/413;
(Continued)

(56) References Cited

U.S. PATENT DOCUMENTS 3,853,393 A    12/1974   Fila et al.
6,341,710 B1    1/2002   Danielson et al.
(Continued)

FOREIGN PATENT DOCUMENTS

CN   101814315 A   8/2010
CN   102486932 A   6/2012
(Continued)

OTHER PUBLICATIONS

Chang et al., "A 7nm 256Mb SRAM in High-K Metal-Gate FinFET Technology with Write-Assist Circuitry for Low-$V_{min}$ Applications," ISSCC 2017/Session 12/SRAM/12.1, 3 pages.
(Continued)

*Primary Examiner* — Alfredo Bermudez Lozada
(74) *Attorney, Agent, or Firm* — Sterne, Kessler, Goldstein & Fox P.L.L.C.

(57) ABSTRACT

A write assist circuit can include a control circuit and a voltage generator. The control circuit can be configured to receive memory address information associated with a memory write operation for memory cells. The voltage generator can be configured to provide a reference voltage to one or more bitlines coupled to the memory cells. The voltage generator can include two capacitive elements, where during the memory write operation, (i) one of the capacitive elements can be configured to couple the reference voltage to a first negative voltage, and (ii) based on the memory address information, both capacitive elements can
(Continued)

be configured to cumulatively couple the reference voltage to a second negative voltage that is lower than the first negative voltage.

20 Claims, 8 Drawing Sheets

Related U.S. Application Data continuation of application No. 15/800,443, filed on Nov. 1, 2017, now Pat. No. 10,734,066.

(60) Provisional application No. 62/538,259, filed on Jul. 28, 2017.

(51) Int. Cl.
*G11C 7/12* (2006.01)
*G11C 11/412* (2006.01)
*G11C 11/418* (2006.01)
*H03K 19/013* (2006.01)

(52) U.S. Cl.
CPC ........ *G11C 11/418* (2013.01); *H03K 19/0136* (2013.01)

(58) Field of Classification Search
CPC . G11C 11/419; G11C 11/411; G11C 11/4113; G11C 11/4116; G11C 11/4125; G11C 11/414; G11C 11/415; G11C 11/416; G11C 11/417; G11C 11/418
See application file for complete search history.

(56) References Cited

U.S. PATENT DOCUMENTS

| | | | |
|---|---|---|---|
| 8,687,437 B2 | 4/2014 | Kim et al. | |
| 9,030,893 B2 | 5/2015 | Jung et al. | |
| 9,240,234 B2 | 1/2016 | Kim et al. | |
| 9,449,680 B2 | 9/2016 | Huang | |
| 9,478,277 B1 | 10/2016 | Liu | |
| 10,734,066 B2 | 8/2020 | Fujiwara et al. | |
| 2007/0081379 A1 | 4/2007 | Clinton et al. | |
| 2007/0200998 A1 | 8/2007 | Schrimmer et al. | |
| 2012/0206988 A1* | 8/2012 | Song | G11C 7/12 365/189.011 |
| 2014/0219009 A1 | 8/2014 | Chow et al. | |
| 2015/0131364 A1 | 5/2015 | Hsieh et al. | |
| 2015/0170721 A1 | 6/2015 | Dubey et al. | |
| 2015/0206577 A1 | 7/2015 | Gong et al. | |
| 2015/0262655 A1* | 9/2015 | Hsieh | G11C 7/12 365/154 |
| 2016/0042784 A1 | 2/2016 | Rim et al. | |
| 2017/0004874 A1 | 1/2017 | Braceras et al. | |
| 2017/0004876 A1 | 1/2017 | Chandra et al. | |
| 2017/0092352 A1 | 3/2017 | Sano et al. | |
| 2017/0117034 A1 | 4/2017 | Hebig et al. | |

FOREIGN PATENT DOCUMENTS

| | | |
|---|---|---|
| CN | 104981875 A | 10/2015 |
| CN | 106409328 A | 2/2017 |
| DE | 2 246 737 | 4/1974 |
| TW | I570718 B | 2/2017 |
| WO | WO 2009/098719 A1 | 8/2009 |
| WO | WO 2013/188805 A2 | 12/2013 |

OTHER PUBLICATIONS

Extended European Search Report issued in European Patent Application No. 16 878 795.0 dated Jul. 18, 2019.
Office Action, dated Mar. 24, 2020, for Chinese Intellectual Property Office Appl. No. 201810050448.2, 14 pages.
Office Action, dated Jan. 20, 2020, for Korean Intellectual Property Office Appl. No. 10-2017-0165119, 5 pages.

* cited by examiner

STATIC RANDOM ACCESS MEMORY WITH WRITE ASSIST CIRCUIT

CROSS-REFERENCE TO RELATED APPLICATION

This application is a continuation of U.S. patent application Ser. No. 16/983,749, titled "Static Random Access Memory with Write Assist Circuit" and filed on Aug. 3, 2020, which is a continuation of U.S. patent application Ser. No. 15/800,443, titled "Static Random Access Memory with Write Assist Circuit" and filed on Nov. 1, 2017, which claims the benefit of U.S. Provisional Patent Application No. 62/538,259, titled "Static Random Access Memory with Write Assist Circuit" and filed on Jul. 28, 2017, which are all incorporated herein by reference in their entireties.

BACKGROUND

Static random access memory (SRAM) is a type of semiconductor memory used in computing applications that require, for example, high-speed data access. For example, cache memory applications use SRAMs to store frequently-accessed data—e.g., data accessed by a central processing unit.

The SRAM's cell structure and architecture enable high-speed data access. The SRAM cell includes a bi-stable flip-flop structure including, for example, four to six transistors. An SRAM architecture can include one or more arrays of memory cells and support circuitry. Each of the SRAM arrays is arranged in rows and columns called "wordlines" and "bitlines," respectively. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
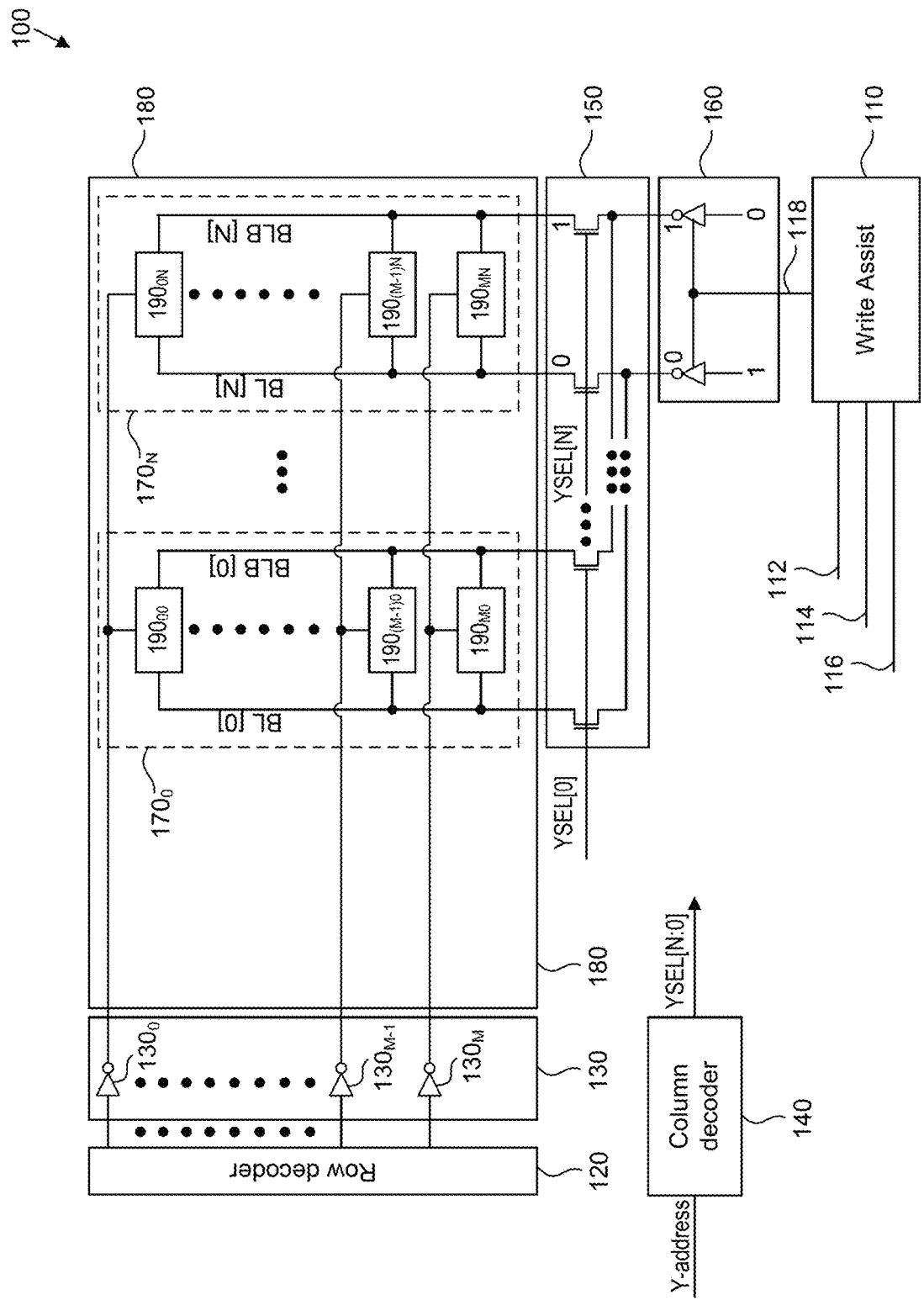
FIG. 1 is an illustration of a static random access memory with a write assist circuit, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The following disclosure describes aspects of a static random access memory (SRAM). Specifically, the disclosure describes different embodiments related to an SRAM memory write operation. For ease of explanation, certain SRAM circuit elements and control logic are disclosed to facilitate in the description of the different embodiments. A person of ordinary skill in the art will understand that SRAMs also include other circuit elements and control logic. These other circuit elements and control logic are within the spirit and scope of this disclosure.

FIG. 1 is an illustration of a static random access memory (SRAM) 100 with a write assist circuit 110, according to some embodiments of the present disclosure. SRAM 100 includes a row decoder 120, a wordline driver 130, a column decoder 140, a column multiplexer (MUX) 150, a write driver circuit 160, and an SRAM array 180. SRAM array 180 includes columns of SRAM cells $170_0$-$170_N$. In some embodiments, as illustrated in FIG. 1, write assist circuit 110, column MUX 150, and write driver circuit 160 are proximately located near a lower portion of SRAM array 180.

Each of the SRAM cells in SRAM array 180 is accessed—e.g., for memory read and memory write operations—using a memory address. Based on the memory address, row decoder 120 selects a row of memory cells to access via wordline driver 130. Also, based on the memory address, column decoder 140 selects a column of memory cells $170_0$-$170_N$ to access via write assist circuit 110 and column MUX 150, according to some embodiments of the present disclosure. In some embodiments, write driver circuit 160 generates voltages for bitline pairs BL/BLB in columns of memory cells $170_0$-$170_N$. The notation "BL" refers to a bitline, and the notation "BLB" refers to the complement of "BL"; the bitline pair BL/BLB concept is well-known in the art. The intersection of the accessed row and the accessed column of memory cells results in access to a single memory cell 190.

Each of columns of memory cells $170_0$-$170_N$ includes memory cells 190. A person of ordinary skill in the art would understand that memory cells 190 can be arranged in one or more arrays in SRAM 100. In the present disclosure, a single SRAM array 180 is shown to simplify the description of the disclosed embodiments. SRAM array 180 has "M" number of rows and "N" number of columns. The notation "$190_{00}$" refers to memory cell 190 located in row '0', column $170_0$. Similarly, the notation "$190_{MN}$" refers to memory cell 190 located in row 'M', column $170_N$.

Figure 2:
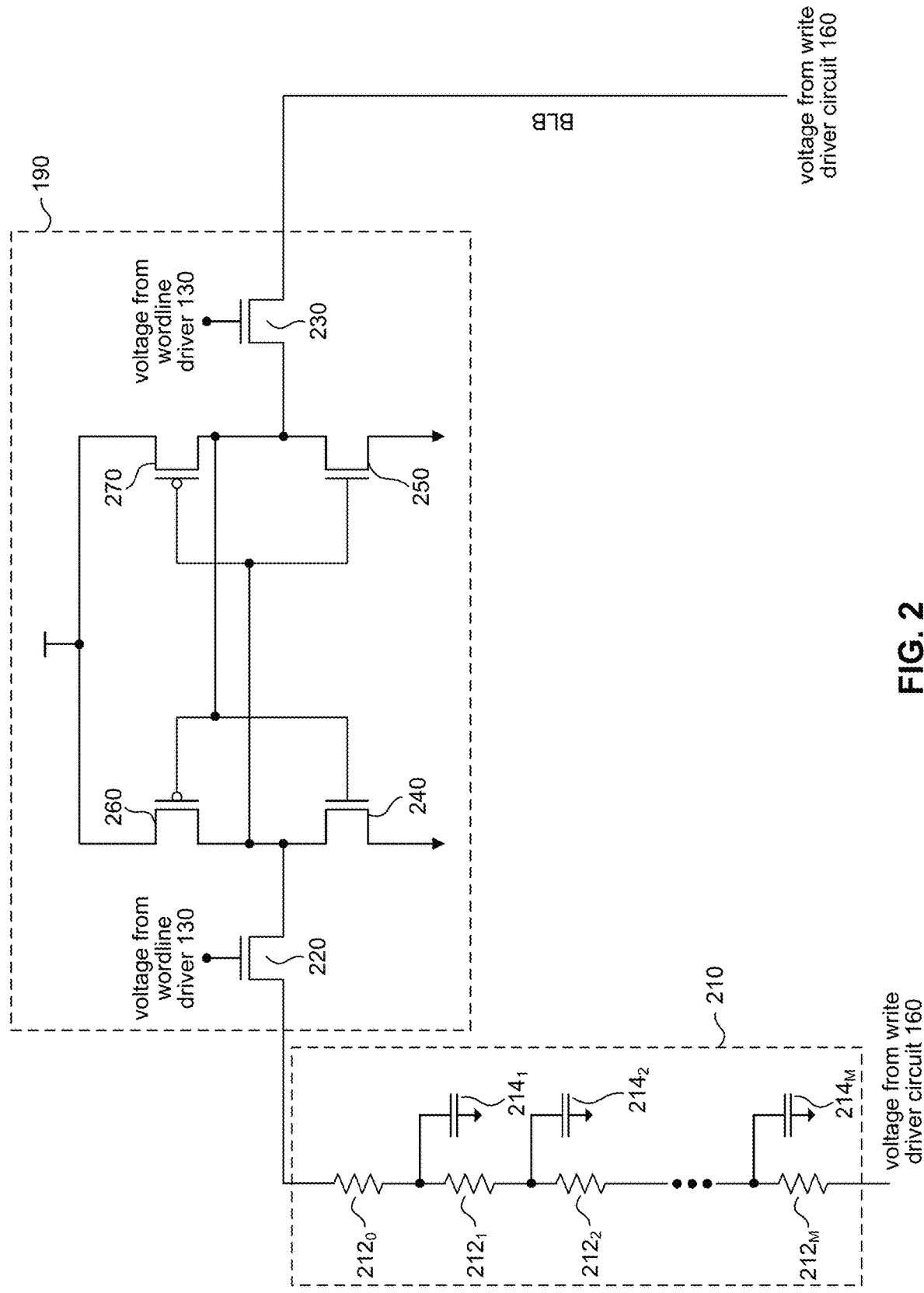
FIG. 2 is an illustration of an example static random access memory topology.

As would be understood by a person of ordinary skill in the art, memory cell 190 can have different circuit topologies. For example, memory cell 190 can have a "6T" circuit topology. FIG. 2 is an illustration of an example 6T circuit topology for memory cell 190. The 6T circuit topology includes n-channel metal-oxide-semiconductor (NMOS) pass devices 220 and 230, NMOS pull-down devices 240 and 250, and p-channel metal-oxide-semiconductor (PMOS) pull-up devices 260 and 270. A voltage from wordline driver 130 controls NMOS devices 220 and 230 to pass voltages from the bitline pair BL/BLB to a bi-stable flip-flop structure formed by NMOS devices 240 and 250 and PMOS devices 260 and 270. The bitline pair BL/BLB voltages can be used during a memory write operation. For example, if BL is at a '1' or a logic high value (e.g., a power supply voltage $V_{DD}$ such as 0.4V, 0.6V, 0.7V, 1.0V, 1.2V, 1.8V, 2.4V, 3.3V, 5V, or any combination thereof) and BLB is at a '0' or a logic low value (e.g., ground or 0V), the voltage applied by wordline driver 130 to the gate terminals of NMOS pass devices 220 and 230 can be at a sufficient voltage level to pass the BL's logic high value and the BLB's logic low value to the bi-stable flip-flop structure. As a result, these logic values are written (or programmed) into the bi-stable flip-flop structure.

Figure 3:
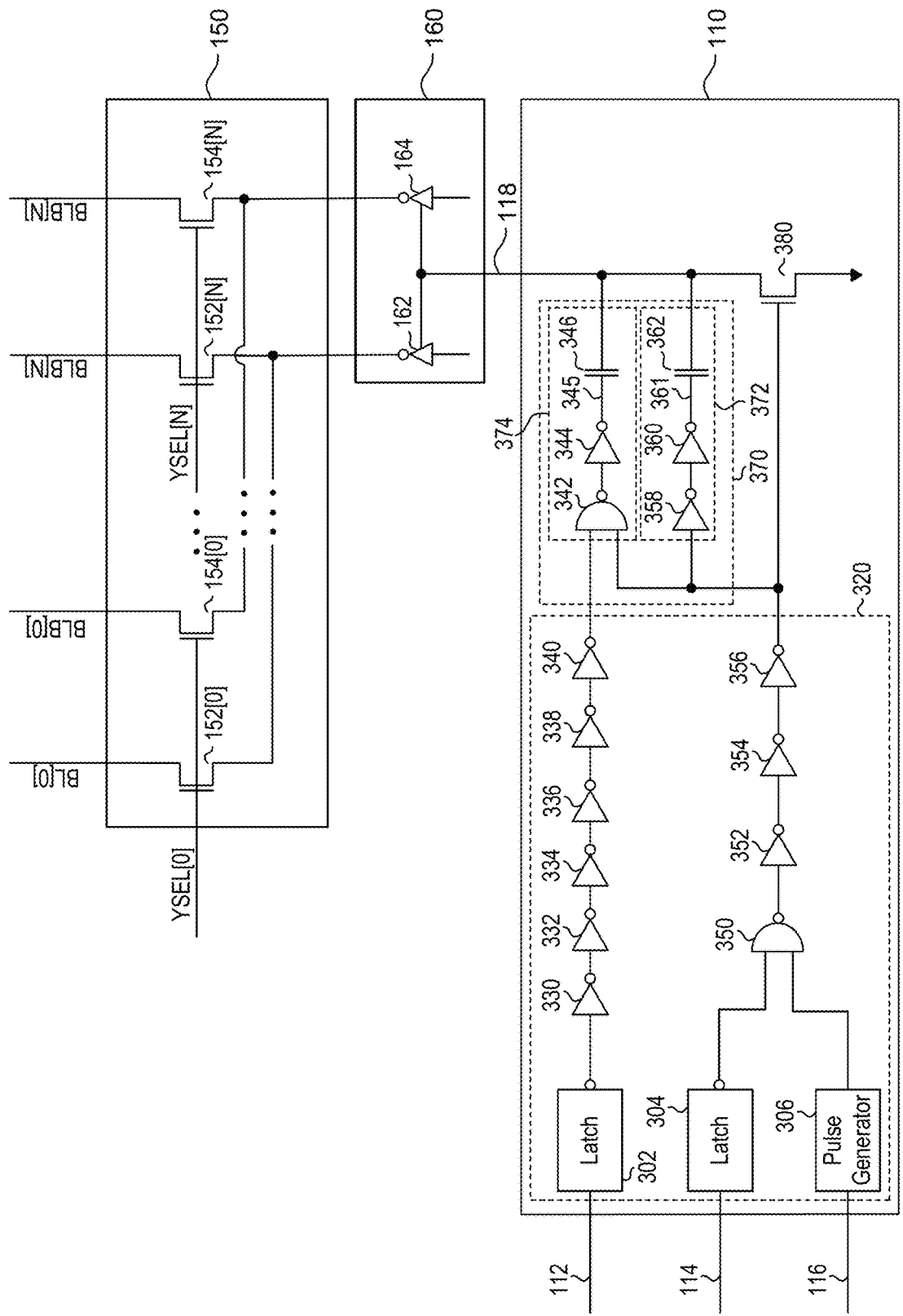
FIG. 3 is an illustration of a write assist circuit, a column multiplexer, and a write driver circuit of a static random access memory, according to some embodiments of the present disclosure.

FIG. 3 is an illustration of write assist circuit 110, column MUX 150, and write driver circuit 160, according to some embodiments of the present disclosure. Write assist circuit 110 includes a control circuit 320, a voltage generator 370, and a pull-down device 380.

Control circuit 320 controls the functionality of voltage generator 370 and pull-down device 380. For example, during a memory write operation, control circuit 320 can couple a reference voltage—e.g., provided to write driver circuit 160 of FIG. 1—to a first negative voltage via voltage generator 370 and/or pull-down device 380. Based on memory address information, control circuit 320 can cumulatively couple the reference voltage to a second negative voltage lower than the first negative voltage via voltage generator 370. As described further below, the various reference voltages can compensate for weaker NMOS pass devices (e.g., NMOS pass devices 220 and 230) in an SRAM cell (e.g., memory cell 190 of FIG. 2).

Control circuit 320 includes latch circuits 302 and 304, a pulse generator 306, inverter logic devices 330-340 and 352-356, and a NAND logic device 350. Based on the description herein, a person of ordinary skill in the art will recognize that the number and type of logic devices in control circuit 320 are not limiting and that a different number and different types of logic devices can be used to implement control circuit 320 based on, for example, functionality and a desired signal propagation delay. In some embodiments, control circuit 320 receives the following signals as inputs: a row signal 112, a negative bitline (NBL) enable signal 114, and a pulse enable signal 116.

Row signal 112 indicates a location of memory cell 190 in SRAM array 180 subject to a memory write operation, according to some embodiments of the present disclosure. In some embodiments, SRAM array 180 can be partitioned into two portions: an upper portion and a lower portion. For example, SRAM array 180 can have 1024 rows—i.e., M=1024 ($2^{10}$). In referring to FIG. 1, the upper portion of SRAM array 180 can be defined by memory cells 190 in rows '0' through '511', and the lower portion of SRAM array 180 can be defined by memory cells 190 in rows '512' through '1024'. Based on the description herein, a person of ordinary skill in the art will recognize that SRAM array 180 can have a different number of rows (e.g., more or less than 1024 rows) and can be partitioned in different ways (e.g., partitioned into more than 2 portions, partitioned into portions with different number of rows, or a combination thereof).

In some embodiments, row signal 112 can represent a most significant bit of a binary representation of a row location. For example, for SRAM array 180 with 1024 rows, the binary representation of row '400' is [0110010000], in which the most significant bit is '0'. In some embodiments, a most significant bit of '0' represents a row in the upper portion of SRAM array 180. In another example, the binary representation of row '1000' is [1111101000], in which the most significant bit is '1'. In some embodiments, a most significant bit of '1' represents a row in the lower portion of SRAM array 180.

In control circuit 320, latch circuit 302 receives row signal 112, stores row signal 112, and outputs an inverted representation of row signal 112 (e.g., either '0' or '1'), according to some embodiments of the present disclosure. For example, if row signal 112 is a '0' (e.g., representative of a row in the upper portion of SRAM array 180), then latch circuit 302 outputs a '1' or logic high value. Conversely, if row signal 112 is a '1' (e.g., representative of a row in the lower portion of SRAM array 180), then latch circuit 302 outputs a '0' or logic low value. The output of latch circuit 302 is propagated to the output of inverter logic device 340 via inverter logic devices 330-340.

In control circuit 320, latch circuit 304 receives NBL enable signal 114, and pulse generator 306 receives pulse enable signal 116. NBL enable signal 114 activates an NBL voltage during a memory write operation, according to some embodiments of the present disclosure. Pulse enable signal 116 activates pulse generator 306 to provide a pulse signal to indicate a time period for the memory write operation, according to some embodiments of the present disclosure.

When NBL enable signal 114 is at a '0' or logic low value, latch circuit 304 outputs a '1' or logic high value, which is provided as an input to NAND logic device 350. When pulse enable signal 116 is at a '1' or logic high value, pulse generator 306 is activated and transitions its output from a '0' to a '1' (e.g., from a logic low to a logic high value), which is provided as another input to NAND logic device 350. With both inputs of NAND logic device 350 at '1' or the logic high value, an output of inverter logic device 356 is also at '1' or the logic high value.

Reference voltage 118 is received by write driver circuit 160 as a reference voltage with a low voltage potential, according to some embodiments of the present disclosure. In some embodiments, write driver circuit 160 includes level-shifter devices 162 and 164 that each receive reference voltage 118. With a logic low input received by either level-shifter device 162 or 164, the level-shifter device outputs a logic high value (e.g., a power supply voltage $V_{DD}$ of the inverter logic device such as 0.4V, 0.6V, 0.7V, 1.0V, 1.2V, 1.8V, 2.4V, 3.3V, 5V, or any combination thereof). Conversely, with a logic high input received by either level-shifter device 162 or 164, the level-shifter device outputs reference voltage 118.

Reference voltage 118 can be ground (e.g., 0V), a negative voltage (e.g., −100 mV, −200 mV, or −300 mV), or a combination thereof, according to some embodiments of the present disclosure. In some embodiments, reference voltage 118 is initialized to ground by pull-down device 380. In some embodiments, pull-down device 380 can be an NMOS transistor that passes ground to reference voltage 118 based on a voltage potential applied to the NMOS transistor's gate terminal—e.g., output of inverter logic device 356 from control circuit 320. For example, when NBL enable signal 114 is at a '0' or logic low value and pulse enable signal 116 is at a '1' or logic high value, the output inverter logic device 356 is also at '1' or the logic high value. In turn, the gate terminal of pull-down device 380 is activated, thus pulling a reference voltage 118 towards ground or 0V. As discussed above, with a logic high input received by either level-shifter device 162 or 164, the inverter logic device outputs reference voltage 118 or, for example, ground (e.g., 0V).

In some embodiments, voltage generator 370 can "pull" reference voltage 118 from ground to a negative voltage level. Voltage generator 370 includes an NBL initialization coupling circuit 372 and an NBL tuning coupling circuit 374, according to some embodiments. NBL initialization coupling circuit 372 includes inverter logic devices 358 and 360 and a capacitive element 362. NBL tuning coupling circuit 374 includes NAND logic device 342, an inverter logic device 344, and a capacitive elements 346. In some embodiments, capacitive elements 362 and 364 can be a capacitor, a capacitive circuit (e.g., with one or more circuit elements configured to have a capacitive or capacitor function), or a combination thereof. Based on the description herein, a person of ordinary skill in the art will recognize that the number and type of logic devices in NBL initialization coupling circuit 372 and NBL tuning coupling circuit 374 are not limiting and that a different number and different types of logic devices can be used to implement NBL tuning coupling circuit 372 and NBL tuning coupling circuit 374.

As discussed above, when reference voltage 118 is at ground, the output of inverter logic device 356 is at '1' or a logic high value. In turn, the output of inverter logic device 360 in NBL initialization coupling circuit 372 is also at '1' or the logic high value. With these voltages, a plate of capacitive element 362 at a circuit node 361—i.e., between inverter logic device 360 and capacitive element 362—is at the logic high value and another plate of capacitive element 362—e.g., a capacitor plate electrically connected to reference voltage 118— is at ground. Thus, a voltage potential equivalent to the logic high value (e.g., a power supply voltage $V_{DD}$ such as 0.4V, 0.6V, 0.7V, 1.0V, 1.2V, 1.8V, 2.4V, 3.3V, 5V, or any combination thereof) is across capacitive element 362.

In some embodiments, if memory cell 190 in the upper portion of SRAM array 180 (e.g., an SRAM cell in rows '0' through '511' in an SRAM array with 1024 rows) is subject to the memory write operation, row signal 112 can be at a '1' or logic high value, which is transferred to an input of NAND logic device 342 via inverter logic devices 330-340. And since the other input of NAND logic device 342 is at a '1' or a logic high value (e.g., logic high output of inverter logic device 356), the output of NAND logic device 342 is at a '0' or logic low value. This output from NAND logic device 342 generates a '1' or logic high value at an output of inverter logic device 344. With these voltages, a plate of capacitive element 346 at a circuit node 345—i.e., between inverter logic device 344 and capacitive element 346—is at the logic high value and another plate of capacitive element 346—e.g., a capacitor plate electrically connected to reference voltage 118—is at ground. Thus, a voltage potential equivalent to the logic high value (e.g., a power supply voltage $V_{DD}$ such as 0.4V, 0.6V, 0.7V, 1.0V, 1.2V, 1.8V, 2.4V, 3.3V, 5V, or any combination thereof) is across capacitive element 346.

Figure 4:
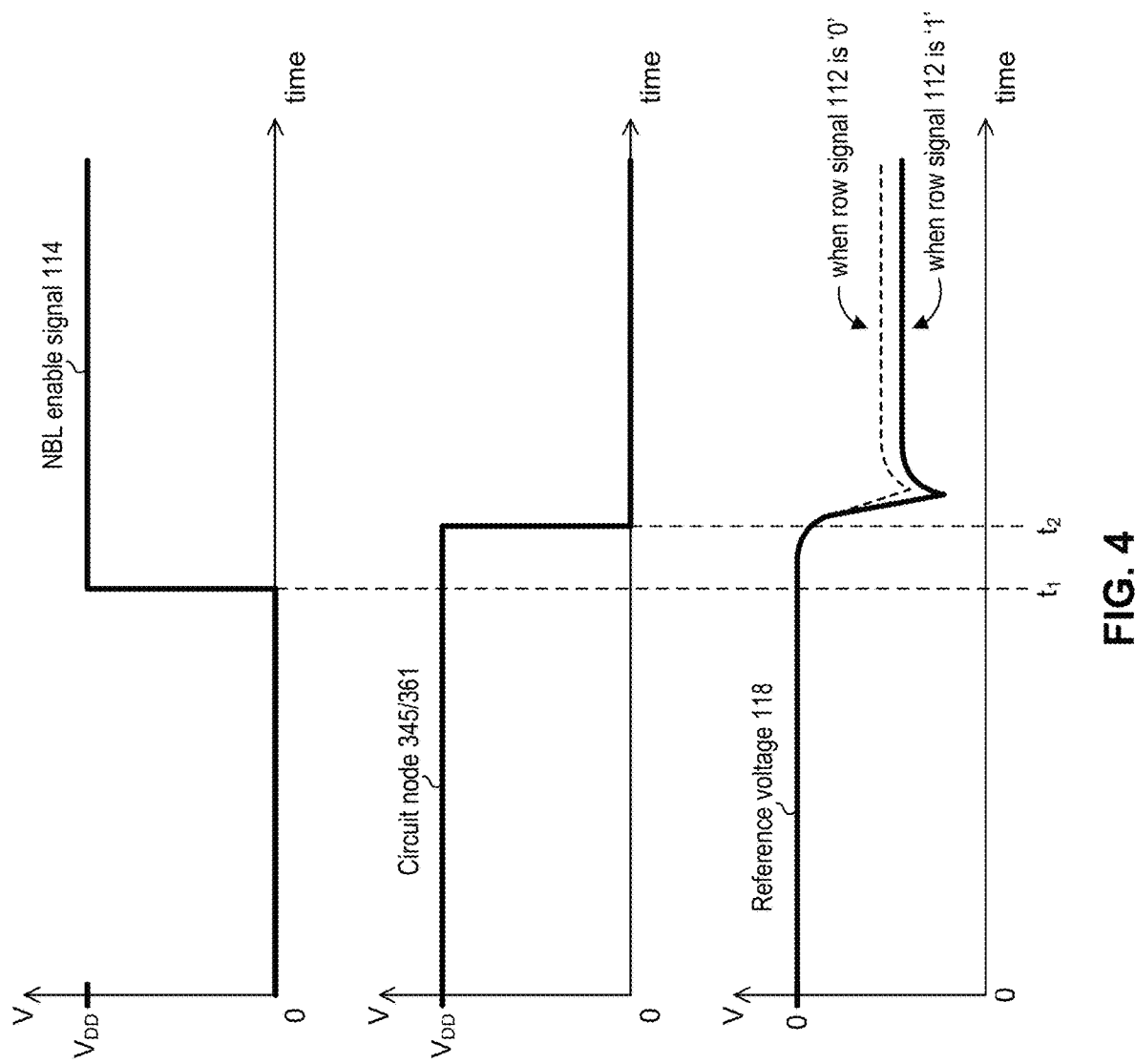
FIG. 4 is an illustration of example signal waveforms for a write assist circuit, according to some embodiments of the present disclosure.

FIG. 4 is an illustration of example signal waveforms for write assist circuit 110, according to some embodiments of the present disclosure. By way of example and not limitation, FIG. 4 shows signal waveforms for NBL enable signal 114, circuit nodes 345 and 361, and reference voltage 118.

During the memory write operation, these example waveforms assume that pulse enable signal 116 is at a '1' or logic high value, thus activating pulse generator 306 and transitioning its output from a '0' to a '1' (e.g., from a logic low to a logic high value). In addition, the example waveforms assume that a memory cell in the upper portion of SRAM array 180 of FIG. 1 is subject to the memory write operation, in which row signal 112 is at a '1' or logic high value.

From time=0 to time $t_1$, NBL enable signal 114 is at a '0' or a logic low value. In turn, circuit nodes 345 and 361 are at a '1' or a logic high value (e.g., a power supply voltage $V_{DD}$ such as 0.4V, 0.6V, 0.7V, 1.0V, 1.2V, 1.8V, 2.4V, 3.3V, 5V, or any combination thereof). Also, with NBL enable signal 114 at a '0', the output of inverter logic device 356 is at a '1' or logic high value, thus activating pull-down device 380 and passing ground (e.g., 0V) to reference voltage 118.

At time $t_1$, NBL enable signal 114 transitions from '0' to '1' (e.g., from a logic low to a logic high value). In referring to FIG. 3, with NBL enable signal 114 transitioning from '0' to '1', the output of inverter logic device 356 transitions from a '1' to '0' (e.g., from a logic high to a logic low value), thus deactivating pull-down device 380. Without being "pulled" to ground by pull-down device 380, reference voltage 118 is floating at a voltage level near or at ground.

At time $t_2$, due to NBL enable signal 114 transitioning from '0' to '1', circuit nodes 345 and 361 transition from '1' to '0' (e.g., from a logic high to a logic low value). In referring to FIG. 3, the delay between time $t_1$ and time $t_2$ can be attributed to propagation delay times set by inverter logic devices 358 and 360 in NBL initialization coupling circuit 372 and NAND logic device 342 and inverter logic device 345 in NBL tuning coupling circuit 374. As a result of circuit nodes 345 and 361 transitioning from '1' to '0', reference voltage 118 is capacitively-coupled to a negative voltage (e.g., −100 mV, −200 mV, or −300 mV). The "dip" in reference voltage 118 is due to an initial charge coupling effect between capacitive elements 346/362 and a capacitive load associated with a bitline pair BL/BLB being accessed during the memory write operation.

In some embodiments, a memory cell in the lower portion of SRAM array 180 of FIG. 1 is subject to the memory write operation, in which row signal 112 is at a '0' or logic low value. In this example, when circuit nodes 345 and 361 transition from '1' to '0' at time $t_2$, reference voltage 118 is capacitively-coupled to a negative voltage. But, this negative voltage is higher than the negative voltage generated when row signal 112 is at a '1' due to a lower charge coupling effect generated by capacitive element 362 (as compared to the charge coupling effect generated by both capacitive elements 346 and 362 when row signal 112 is at a '1').

In some embodiments, the size of capacitive elements 346 and 362 can vary or be the same. The size of capacitive elements 346 and 362 can depend on a desired charge coupling ratio between capacitive elements 346 and 362 and an associated bitline parasitic capacitance (e.g., parasitic capacitances $214_1$-$214_M$ in FIG. 2), according to some embodiments of the present disclosure. As would be understood by a person of ordinary skill in the art, based on the size of capacitive elements 346 and 362, a desired negative voltage can be achieved by voltage generator 370 of FIG. 3.

Based on the description herein, a person of ordinary skill in the art will recognize that SRAM array 180 of FIG. 1 can be partitioned into more than two portions. For example, SRAM array 180 can be partitioned into four portions, in which each portion is a quadrant. For SRAM array 180 with 1024 rows, the first quadrant can be defined by memory cells 190 in rows '0' through '255', the second quadrant can be defined by memory cells 190 in rows '256' through '511', the third quadrant can be defined by memory cells 190 in rows '512' through '767', and the fourth quadrant can be defined by memory cells 190 in rows '768' through '1024'. In some embodiments, in referring to FIG. 3, NBL initialization coupling circuit 372 can be associated with the fourth quadrant of memory cells 190, NBL tuning coupling circuit 374 can be associated with the first quadrant of memory cells 190, another NBL tuning coupling circuit can be associated with the second quadrant of memory cells 190, and yet another NBL tuning coupling circuit can be associated with the third quadrant of memory cells 190.

Similar to latch circuit 302 associated with NBL tuning coupling circuit 374, latch circuits can be associated with the NBL tuning coupling circuits for the second and third quadrants of memory cells 190. For example, if an SRAM cell in the third quadrant is subject to a memory write operation, a bit of a binary representation of a row location associated with SRAM cells in the third quadrant can be received by the latch circuit for the associated NBL tuning coupling circuit. If this bit (e.g., associated with rows in the third quadrant) is a '1', then the NBL tuning coupling circuit can be activated and capacitively couple reference voltage 118 to a negative voltage when NBL enable signal 114 transitions from '0' to '1'. In some embodiments, the charge coupling effect on reference voltage 118 can be generated by capacitive element 362 in NBL initialization coupling circuit 372 and the capacitive element in the NBL tuning coupling circuit for the third quadrant. Due to this cumulative capacitive coupling, reference voltage 118 is at a more negative voltage for memory cells in the third quadrant (e.g., −200 mV) than for memory cells in the fourth quadrant (e.g., −100 mV) during the memory write operation.

If an SRAM cell in the second quadrant is subject to the memory write operation, a bit of a binary representation of a row location associated with SRAM cells in the second quadrant can be received by the latch circuit for the associated NBL tuning coupling circuit. If this bit (e.g., associated with rows in the second quadrant) is a '1', then the NBL tuning coupling circuit can be activated and capacitively couple reference voltage 118 to a negative voltage when NBL enable signal 114 transitions from '0' to '1'. In some embodiments, if the bit is a '1', the NBL tuning circuit for the third quadrant can be activated. As a result, the charge coupling effect on reference voltage 118 can be generated by capacitive element 362 in NBL initialization coupling circuit 372, the capacitive element in the NBL tuning coupling circuit for the third quadrant, and the capacitive element in the NBL tuning coupling circuit for the second quadrant. Due to this cumulative capacitive coupling, reference voltage 118 is at a more negative voltage for memory cells in the second quadrant (e.g., −300 mV) than for memory cells in the third quadrant (e.g., −200 mV) during the memory write operation.

Further, if an SRAM cell in the first quadrant is subject to the memory write operation, a bit of a binary representation of a row location associated with SRAM cells in the first quadrant can be received by latch circuit 302 for the associated NBL tuning coupling circuit 374. If this bit (e.g., associated with rows in the first quadrant) is a '1', then NBL tuning coupling circuit 374 can be activated and capacitively couple reference voltage 118 to a negative voltage when NBL enable signal 114 transitions from '0' to '1'. In some embodiments, if the bit is a '1', the NBL tuning circuits for the second and third quadrants can be activated. As a result, the charge coupling effect on reference voltage 118 can be generated by capacitive element 362 in NBL initialization coupling circuit 372, the capacitive element in the NBL tuning coupling circuit for the third quadrant, the capacitive element in the NBL tuning coupling circuit for the second quadrant, and capacitive element 346 in NBL tuning coupling circuit 374. Due to this cumulative capacitive coupling, reference voltage 118 is at a more negative voltage for memory cells in the first quadrant (e.g., −400 mV) than for memory cells in the second quadrant (e.g., −300 mV) during the memory write operation.

A benefit, among others, of providing different negative voltages to the different portions of SRAM array 180 includes compensating for parasitic elements in the bitline pair BL/BLB. FIG. 2 shows an example bitline parasitic model 210 and memory cell 190. Bitline parasitic model 210 is depicted for bitline BL for explanation purposes. A person of ordinary skill in the art, based on the description herein, will recognize that the bitline BLB can have a similar bitline parasitic model. A network of resistor elements $212_0$-$212_M$ and capacitive elements $214_1$-$214_M$ (e.g., capacitors, capacitive circuits, or a combination thereof) represents bitline parasitic model 210. Each resistor element 212 represents a bitline BL path resistance between two SRAM cells along a column of memory cells. Each capacitive element 214 represents a parasitic capacitance associated with a pass gate in each SRAM cell—e.g., parasitic capacitance associated with transistor 220 in memory cell 190—along the column of memory cells.

During the memory write operation, an addressed SRAM cell located a farther distance from a write driver circuit—e.g., memory cell $190_{ON}$ in FIG. 1—can receive a bitline voltage different from its intended voltage level. This can be due to a voltage differential between the voltage at the output of the write driver circuit (e.g., write driver circuit 160 of FIG. 1) and the voltage at the bitline location associated with the addressed SRAM cell. This voltage differential can be attributed to the bitline path resistance between the write driver circuit and the addressed SRAM cell.

In referring to FIG. 2, resistor elements $212_0$-$210_M$ model the bitline path resistance. If the write driver circuit outputs 0V onto bitline BL, the voltage at an addressed memory cell 190—e.g., located a farther distance from the write driver circuit such as, for example, in the upper portion of SRAM array 180 in FIG. 1—can be greater than 0V due to the "IR" (current*resistance) voltage drop across resistor elements $212_0$-$212_M$. This voltage drop results in an unintended rise in voltage at the bitline location associated with the addressed SRAM cell. This unintended rise in voltage—e.g., voltage greater than 0V—degrades the memory write operation of the SRAM cell because the SRAM cell's bi-stable flip-flop structure may not track its voltage level to the intended voltage—i.e., the write circuit output voltage. In other words, the unintended rise in voltage can prevent the SRAM cell from changing state. Advancing process technologies further exacerbate the effects of this IR voltage drop because the bitline parasitic resistance increases as advancing process technologies decrease the bitline's physical dimensions. In addition, density increases in SRAM arrays also exacerbate the effects of the IR voltage drop because bitline length increases as SRAM arrays grow.

The write assist circuit—e.g., write assist circuit 110 of FIG. 1 described above and write assist circuit 610 of FIG. 6 described below—compensates for the IR voltage drop in the bitlines. For addressed SRAM cells—especially those cells located farther from the write driver circuit (e.g., memory cell $190_{ON}$ in FIG. 1)—the write assist circuit "pulls" the voltage level at the bitline location associated with the addressed SRAM cell closer to an intended voltage level. For example, if a 200 mV bitline IR drop exists between the output of the write driver circuit and an addressed SRAM cell, the reference voltage output from the write driver circuit can be adjusted, for example, to: (i) −300 mV so the bitline voltage at the addressed SRAM cell is near or at −100 mV; (ii) −400 mV so the bitline voltage at the addressed SRAM cell is near or at −200 mV; (iii) −500 mV so the bitline voltage at the addressed SRAM cell is near or at −300 mV; (iv) or any other negative voltage for a desired voltage level at the addressed SRAM cell.

In addition to compensating for the IR voltage drop in the bitlines, the write assist circuit provides negative voltage tuning for different portions of the SRAM array, thus reducing power consumption. For example, for SRAM cells in a lower portion of the SRAM array (e.g., memory cells 190 in rows '0' through '511' of SRAM array 180 in FIG. 1), the write assist circuit can provide a higher negative voltage (e.g., −100 mV) to SRAM cells in this portion as compared to a lower negative voltage (e.g., −200 mV) provided to SRAM cells in an upper portion of the SRAM array (e.g., memory cells 190 in rows '512' through '1024' of SRAM array 180). With the higher negative voltage (i.e., a lower voltage magnitude) provided to the memory cells in the lower portion of the SRAM array, less power is consumed by, for example, the write driver circuit (e.g., write driver circuit 160 of FIG. 1). Further, as described above, the SRAM array can be partitioned into more than two portions (e.g., see quadrant example described above), in which each of the more than two portions can receive a different negative voltage based on a row location of a memory cell subject to the memory write operation. With this further tuning of negative voltages based on memory row location, power consumption can be further optimized.

Further, the write assist circuit also compensates for process variations in the SRAM cell transistors. For example, in referring to FIG. 2, process variations can cause PMOS pull-up devices 260 and 270 to be stronger than NMOS pass devices 220 and 230. This process variation can cause issues during a memory write operation because the PMOS pull-up devices can impede the NMOS pass devices' ability to pull an internal node—e.g., an internal node between the PMOS pull-up device and the NMOS pull-down device—from a power supply voltage $V_{DD}$ (e.g., 0.4V, 0.6V, 0.7V, 1.0V, 1.2V, 1.8V, 2.4V, 3.3V, 5V, or any combination thereof) to ground (e.g., 0V). To compensate for the weaker NMOS pass device, the write assist circuit can provide a negative voltage as a write driver circuit output to promote pulling the internal node to ground.

Figure 5:
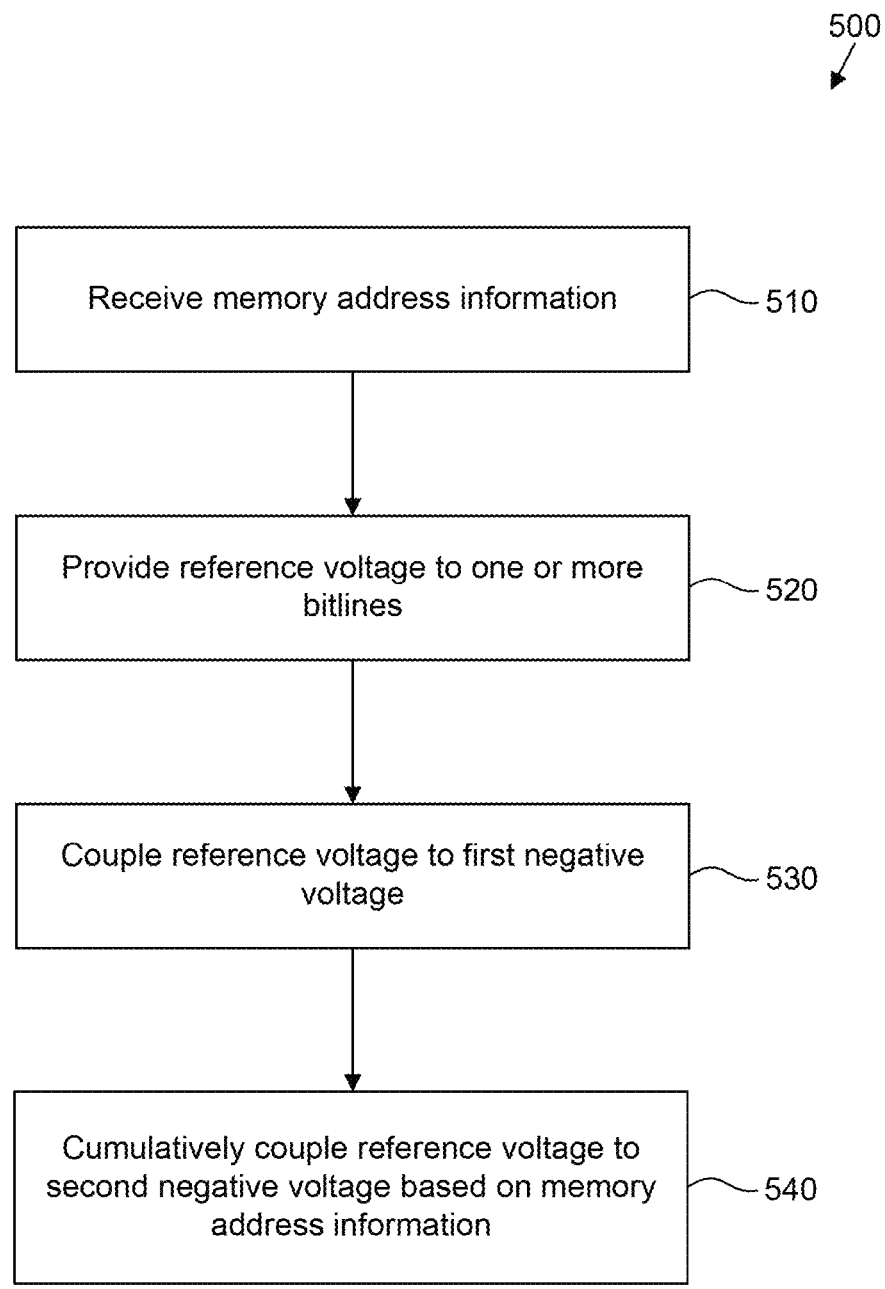
FIG. 5 is an illustration of a method for a memory write operation, according to some embodiments of the present disclosure.

FIG. 5 is an illustration of a method 500 for a memory write operation performed on SRAM 100, according to some embodiments of the present disclosure. The operations shown in method 500 can be performed by, for example, write assist circuit 110 of FIGS. 1 and 3. Other operations in method 500 can be performed. Further, the operations of method 500 can be performed in a different order and/or vary.

At operation 510, memory address information associated with the memory write operation for one or more memory cells is received. In some embodiments, the memory address information includes row location of an SRAM cell subject to the memory write operation. In referring to FIG. 3, control circuit 320 in write assist circuit 110 receives the memory address information.

At operation 520, a reference voltage is provided to one or more bitlines coupled to the one or more memory cells. In some embodiments, the reference voltage can be provided by a pull-down device (e.g., pull-down device 380 of FIG. 3) that initializes the reference voltage to ground prior to coupling the reference voltage to a negative voltage (as discussed below in operations 530 and 540).

At operation 530, the reference voltage is coupled to a first negative voltage with a first capacitive element. For example, in referring to FIGS. 3 and 4, when NBL enable signal 114 transitions from '0' to '1' (e.g., from a logic low to a logic high value), circuit node 361 transitions from '1' to '0', thus capacitively coupling reference voltage 118 to a negative voltage with capacitive element 362. In some embodiments, the reference voltage is coupled to the first negative voltage after the pull-down device is deactivated.

At operation 540, the reference voltage is cumulatively coupled, with the first capacitive element and a second capacitive element, to a second negative voltage lower than the first negative voltage based on the memory address information. For example, in referring to FIGS. 3 and 4, when NBL enable signal 114 transitions from '0' to '1' (e.g., from a logic low to a logic high value), circuit nodes 345 and 361 transition from '1' to '0', thus capacitively coupling reference voltage 118 to the second negative voltage with capacitive elements 346 and 362. In some embodiments, the reference voltage is cumulatively coupled to the second negative voltage after the pull-down device is deactivated.

Figure 6:
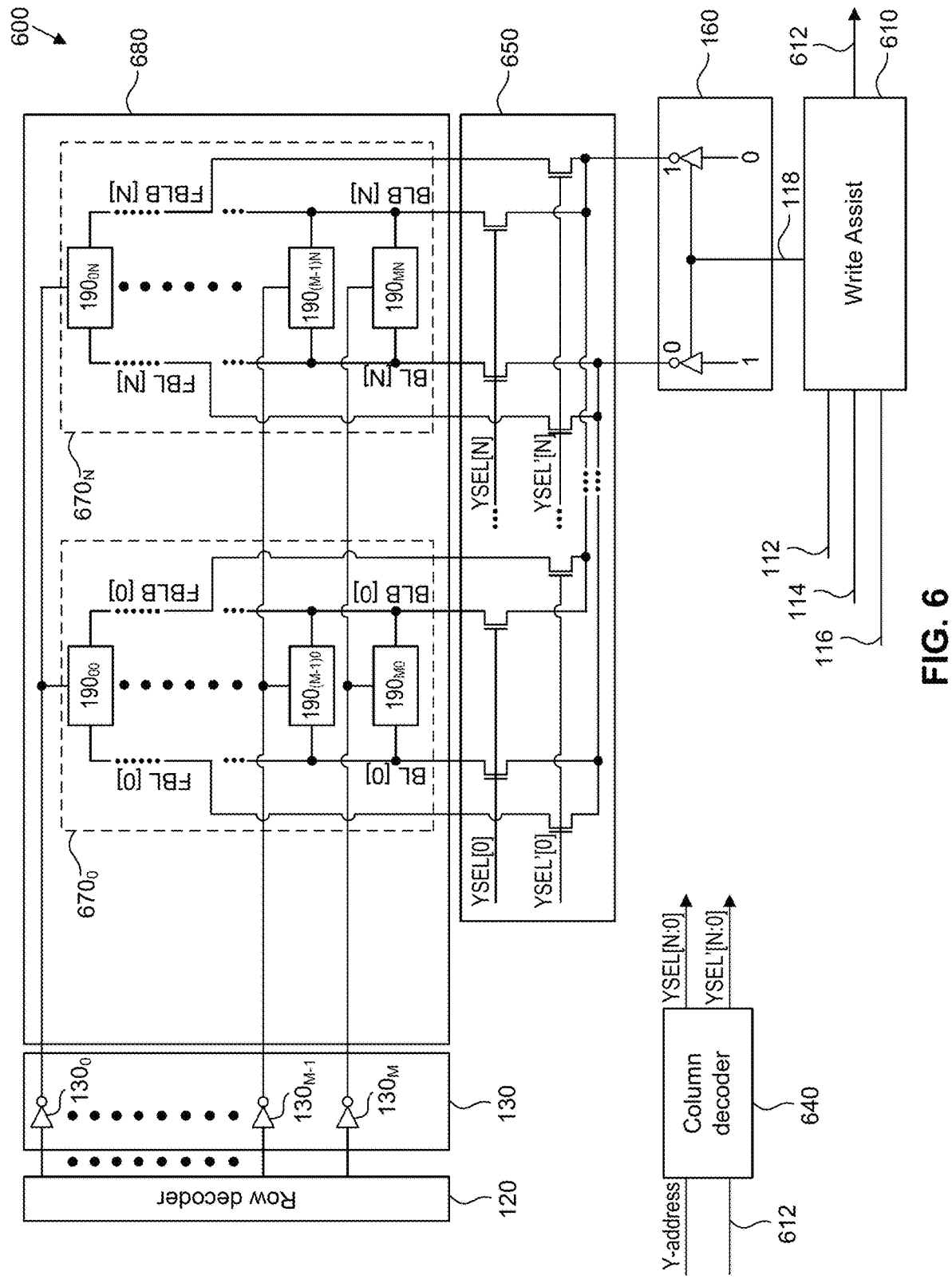
FIG. 6 is an illustration of a static random access memory with an auxiliary bitline topology and write assist circuit, according to some embodiments of the present disclosure.

FIG. 6 is an illustration an SRAM 600 with an auxiliary bitline topology and a write assist circuit 610, according to some embodiments of the present disclosure. SRAM 100 includes row decoder 120, wordline driver 130, a column decoder 640, a column multiplexer (MUX) 650, write driver circuit 160, and an SRAM array 680. Row decoder 120, wordline driver 130, and write driver circuit 160 are described above with respect to FIG. 1. In some embodiments, as illustrated in FIG. 6, write assist circuit 610, column MUX 650, and write driver circuit 160 are proximately located near a lower portion of SRAM array 680.

In some embodiments, SRAM array 680 includes columns of memory cells $670_0$-$670_N$. Each of columns $670_0$-$670_N$ includes memory cells 190. In some embodiments, each of the columns $670_0$-$670_N$ also includes a bitline pair BL/BLB (also referred to herein as "a first set of bitlines) and an auxiliary bitline pair FBL/FBLB (also referred to herein as "a second set of bitlines"). The bitline pair BL/BLB can be used to access memory cells 190 in a lower portion of SRAM array 680 and the auxiliary bitline pair FBL/FBLB can be used to access memory cells 190 in an upper portion of SRAM array 680. For example, for SRAM array 680 with 1024 rows, in each of columns $670_0$-$670_N$, the bitline pair BL/BLB can be coupled to NMOS pass devices (e.g., NMOS pass devices 220 and 230) of memory cells 190 for rows '0' to '511'. The auxiliary bitline pair FBL/FBLB can be coupled to NMOS pass devices of memory cells 190 for rows '512' to '1024. By implementing an alternative bitline path via the auxiliary bitline pair FBL/FBLB to memory cells 190 in the upper portion of SRAM array 180, an overall parasitic resistance and capacitance associated with non-accessed memory cells 190 can be decreased, thus decreasing an IR voltage drop and RC time delay to an accessed memory cell 190 in the upper portion of SRAM array 680.

Column decoder 640 can be used to select either the bitline pair BL/BLB or the auxiliary bitline pair FBL/FBLB based on a location of memory cell 190 in SRAM array 680 subject to a memory write operation, according to some embodiments. In some embodiments, column decoder 640 receives an auxiliary bitline (FBL) enable signal 612, which can indicate whether memory cell 190 is in an upper portion of SRAM array 680 (e.g., a memory cell in rows '512' to '1024'). In some embodiments, if FBL enable signal 612 is a '1' or a logic high value, a corresponding YSEL' [N:0] signal is selected to activate a corresponding y-select transistor in column MUX 650 to access a corresponding auxiliary bitline pair FBL/FBLB. Conversely, if FBL enable signal 612 is a '0' or a logic low value, a corresponding YSEL[N:0] signal is selected to activate a corresponding y-select transistor in column MUX 650 to access a corresponding bitline pair BL/BLB.

Figure 7:
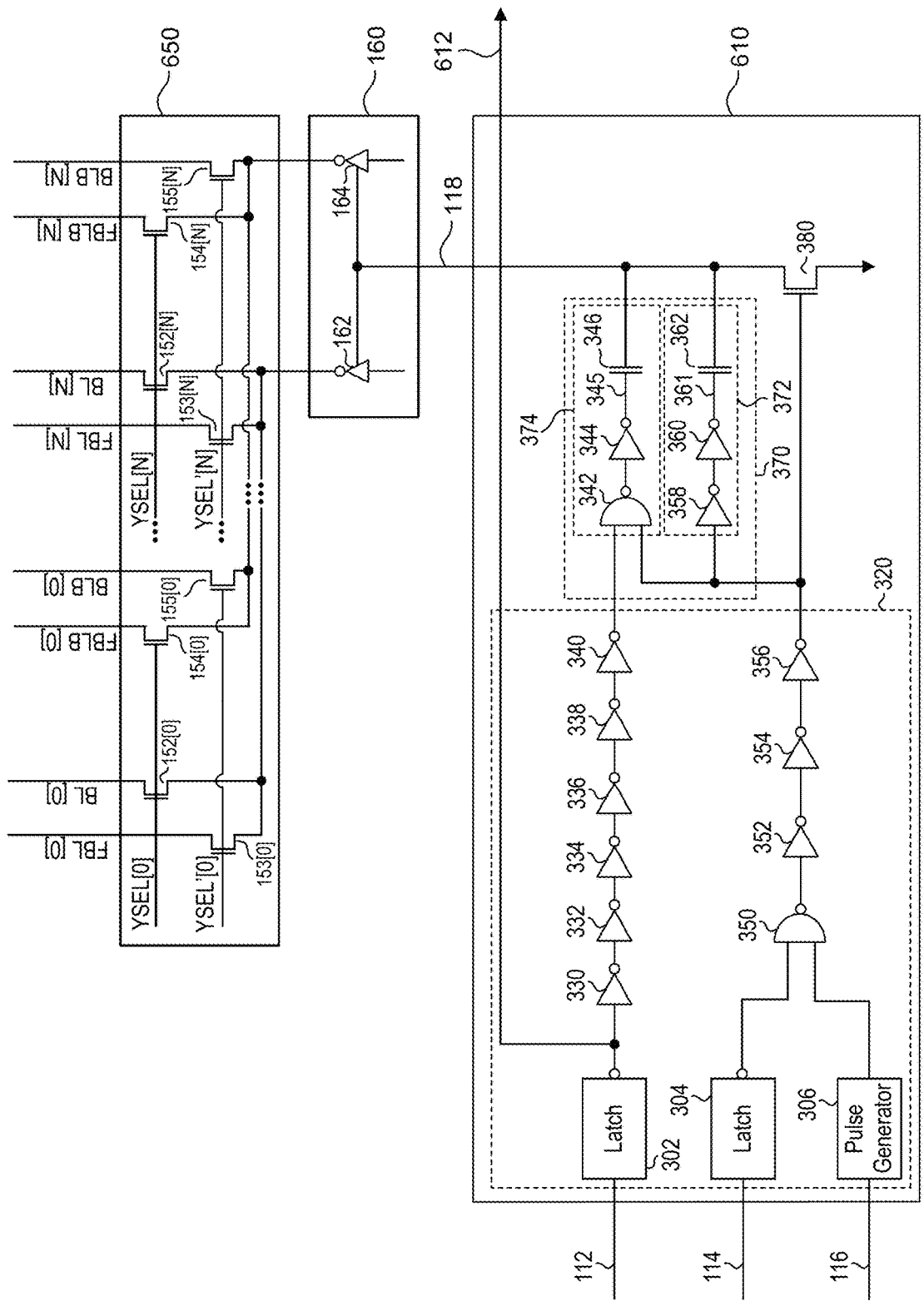
FIG. 7 is an illustration of a write assist circuit, a column multiplexer, and a write driver circuit of a static random access memory with an auxiliary bitline topology, according to some embodiments of the present disclosure.

FIG. 7 is an illustration of write assist circuit 610, column MUX 650, and write driver circuit 160, according to some embodiments of the present disclosure. Write driver circuit 160 is described above with respect to FIGS. 1 and 3.

Write assist circuit 610 includes control circuit 320, voltage generator 370, and pull-down device 380, which are described above with respect to FIG. 3. In control circuit 320, latch 302 outputs FBL enable signal 612. As discussed above, latch circuit 302 receives row signal 112, stores row signal 112, and outputs an inverted representation of row signal 112 (e.g., either '0' or '1'), according to some embodiments of the present disclosure. FBL enable signal 612 is a representation of row signal 112. For example, if row signal 112 is a '0' (e.g., representative of a row in the upper portion of SRAM array 180), then latch circuit 302 outputs a '1' or logic high value and thus FBL enable signal 612 is also a '1' or logic high value. Conversely, if row signal 112 is a '1' (e.g., representative of a row in the lower portion of SRAM array 180), then latch circuit 302 outputs a '0' or logic low value and thus FBL enable signal is also a '0' or a logic low value.

The operation of voltage generator 370 and pull-down device 380 is the same as described above with respect to FIG. 3. To summarize, in referring to FIG. 4 (which assumes row signal 112 and pulse enable signal 116 are both at a '1' or a logic high value), from time=0 to time $t_1$, NBL enable signal 114 is at a '0' or a logic low value. In turn, circuit nodes 345 and 361 are at a '1' or a logic high value (e.g., a power supply voltage $V_{DD}$ such as 0.4V, 0.6V, 0.7V, 1.0V, 1.2V, 1.8V, 2.4V, 3.3V, 5V, or any combination thereof). Also, with NBL enable signal 114 at a '0', the output of inverter logic device 356 is at a '1' or logic high value, thus activating pull-down device 380 and passing ground (e.g., 0V) to reference voltage 118.

At time $t_1$, NBL enable signal 114 transitions from '0' to '1' (e.g., from a logic low to a logic high value). In referring to FIG. 7, with NBL enable signal 114 transitioning from '0' to '1', the output of inverter logic device 356 transitions from a '1' to '0' (e.g., from a logic high to a logic low value), thus deactivating pull-down device 380. Without being "pulled" to ground by pull-down device 380, reference voltage 118 is floating at a voltage level near or at ground.

At time $t_2$, due to NBL enable signal 114 transitioning from '0' to '1', circuit nodes 345 and 361 transition from '1' to '0' (e.g., from a logic high to a logic low value). In referring to FIG. 7, the delay between time $t_1$ and time $t_2$ can be attributed to propagation delay times set by inverter logic devices 358 and 360 in NBL initialization coupling circuit 372 and NAND logic device 342 and inverter logic device 345 in NBL tuning coupling circuit 374. As a result of circuit nodes 345 and 361 transitioning from '1' to '0', reference voltage 118 is capacitively-coupled to a negative voltage (e.g., −100 mV, −200 mV, or −300 mV). The "dip" in reference voltage 118 is due to an initial charge coupling effect between capacitive elements 346/362 and a capacitive load associated with an auxiliary bitline pair BL/BLB being accessed during the memory write operation.

In the above example, since row signal 112 is at a '1', a memory cell in the upper portion of SRAM array 680 of FIG. 6 is subject to the memory write operation. As such, in referring to FIG. 7, FBL enable signal 612 is at a '0' or logic low value. With FBL enable signal 612 at '0', in referring to FIG. 6, a memory cell in the upper portion of SRAM array 680 is accessed; in turn, column decoder 640 outputs a corresponding YSEL' [N:0] signal to activate a corresponding y-select transistor in column MUX 650 to access a corresponding auxiliary bitline pair FBL/FBLB, according to some embodiments.

In some embodiments, a memory cell in the lower portion of SRAM array 680 of FIG. 6 is subject to the memory write operation, in which row signal 112 is at a '0' or logic low value. In this example, when circuit nodes 345 and 361 transition from '1' to '1' at time $t_2$, reference voltage 118 is capacitively-coupled to a negative voltage. But, this negative voltage is higher than the negative voltage generated when row signal 112 is at a '1' due to a lower charge coupling effect generated by capacitive element 362 (as compared to the charge coupling effect generated by both capacitive elements 346 and 362 when row signal 112 is at a '1').

In the above example, since row signal 112 is at a '0', a memory cell in the lower portion of SRAM array 680 of FIG. 6 is subject to the memory write operation. As such, in referring to FIG. 7, FBL enable signal 612 is at a '1' or logic high value. With FBL enable signal 612 at '1', in referring to FIG. 6, a memory cell in the lower portion of SRAM array 680 is accessed; in turn, column decoder 640 outputs a corresponding YSEL'[N:0] signal to activate a corresponding y-select transistor in column MUX 650 to access a corresponding bitline pair BL/BLB, according to some embodiments.

In referring to FIG. 7, NBL initialization coupling circuit 372 of voltage generator 370 can be removed, thus leaving NBL tuning coupling circuit 374. Though not shown in FIG. 7, control logic can be implemented such that, when memory cells 190 in the lower portion of SRAM array 680 are accessed during a memory write operation, write assist circuit 610 provides ground (e.g., 0V) as reference voltage 118. Further, the control logic can be implemented such that, when memory cells 190 in the upper portion of SRAM array 680 are accessed during the memory write operation, write assist circuit 610 provides a negative voltage (e.g., −100 mV, −200 mV, or −300 mV) as reference voltage 118.

As discussed above, the write assist circuit has many benefits such as, for example, compensating for parasitic elements in bitlines, providing negative voltage tuning for different portions of the SRAM array, and compensating for process variations in the SRAM cell transistors. These benefits are also applicable to write assist circuit 610 of FIG. 6.

In referring to FIG. 6, write assist circuit 610 and the auxiliary bitline topology of SRAM array 680 provide additional benefits. For example, the auxiliary bitline topology can provide a "more" negative voltage to memory cells located farther away from write driver circuit 160 (e.g., in the upper portion of SRAM array 680) without disturbing memory cells located closer to write driver circuit 160 (e.g., in the lower portion of SRAM array 680). The "more" negative voltage can compensate for parasitic elements in the bitlines, especially as bitlines lengthen due to higher density SRAM devices. Due to the auxiliary bitline topology, the "more" negative voltage does not pass through bitline pairs BL/BLB, thus minimizing voltage disturbances to memory cells accessed through bitline pairs BL/BLB.

Based on the description herein, a person of ordinary skill in the art will recognize that SRAM array 680 of FIG. 6 can be partitioned into more than two portions. For example, SRAM array 680 can be partitioned into four portions, in which each portion is a quadrant. For SRAM array 680 with 1024 rows, the first quadrant can be defined by memory cells 190 in rows '0' through '255', the second quadrant can be defined by memory cells 190 in rows '256' through '511', the third quadrant can be defined by memory cells 190 in rows '512' through '767', and the fourth quadrant can be defined by memory cells 190 in rows '768' through '1024'. In some embodiments, in referring to FIG. 7, NBL initialization coupling circuit 372 can be associated with the fourth quadrant of memory cells 190, NBL tuning coupling circuit 374 can be associated with the first quadrant of memory cells 190, another NBL tuning coupling circuit can be associated with the second quadrant of memory cells 190, and yet another NBL tuning coupling circuit can be associated with the third quadrant of memory cells 190.

The operation of write assist circuit 610 with this quadrant architecture is similar to the operation of write assist circuit 110 described above with respect to the quadrant example of SRAM array 180. A difference in the two quadrant examples is that the architecture of SRAM array 680 includes auxiliary bitline pairs FBL/FBLB. In some embodiments, the auxiliary bitline pairs FBL/FBLB can be used to access memory cells 190 in the upper portion of SRAM array 680—e.g., memory cells in the first and second quadrants. In some embodiments, the bitline pairs BL/BLB can be used to access memory cells 190 in the lower portion of SRAM array 680—e.g., memory cells in the third and fourth quadrants.

Figure 8:
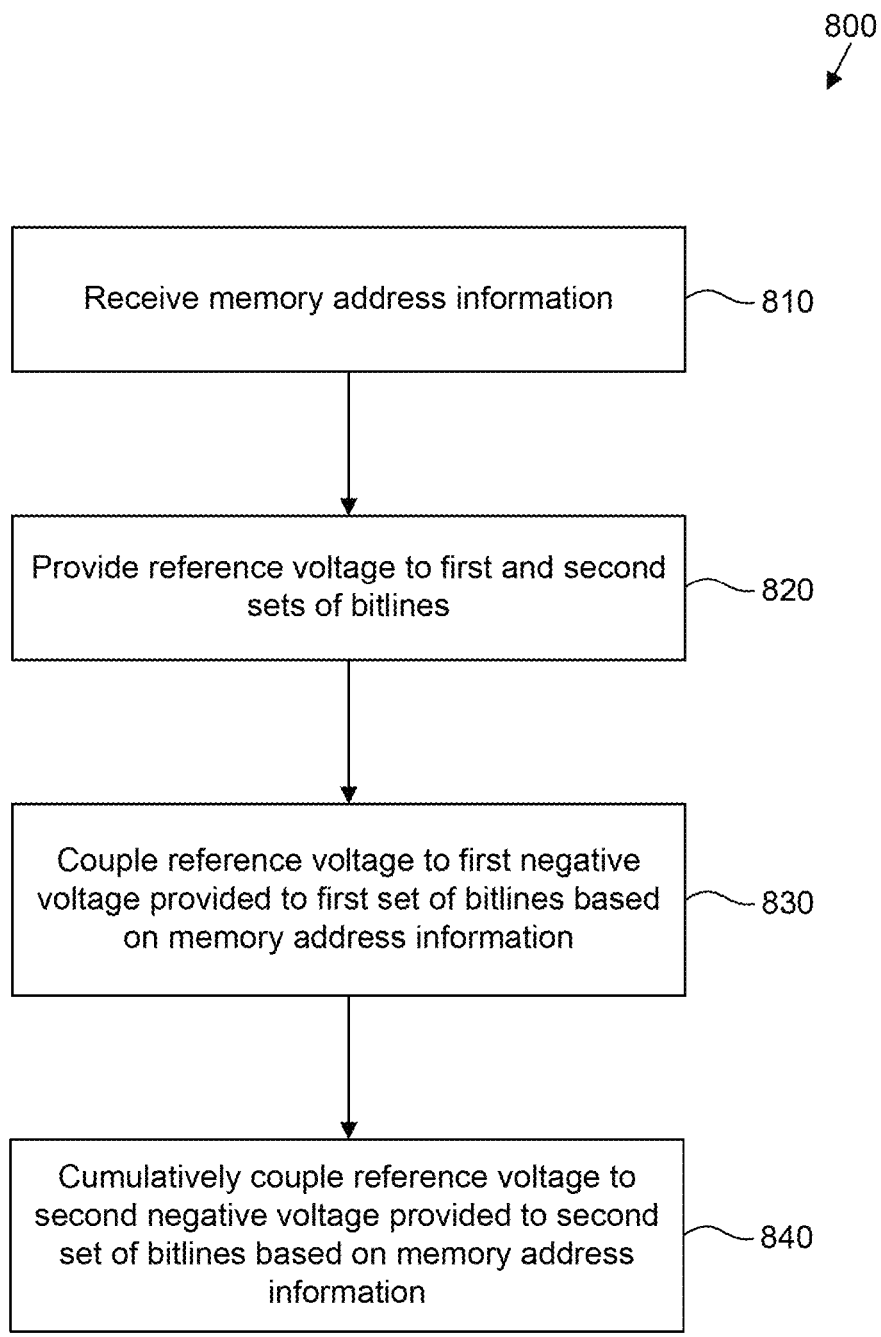
FIG. 8 is an illustration of a method for a memory write operation performed on a static random access memory with an auxiliary bitline topology and a write assist circuit, according to some embodiments.

FIG. 8 is an illustration of a method 800 for a memory write operation performed on SRAM 600, according to some embodiments of the present disclosure. The operations shown in method 800 can be performed by, for example, write assist circuit 610 of FIGS. 6 and 7. Other operations in method 800 can be performed. Further, the operations of method 800 can be performed in a different order and/or vary.

At operation 810, memory address information associated with the memory write operation for one or more memory cells in an array of memory cells is received. In some embodiments, the memory address information includes row location of an SRAM cell subject to the memory write operation. In referring to FIG. 7, control circuit 320 in write assist circuit 610 receives the memory address information.

At operation 820, a reference voltage is provided to a first set of bitlines coupled to a first of memory cells in the array and a second set of bitlines coupled to a second set of memory cells in the array. In some embodiments, the reference voltage can be provided by a pull-down device (e.g., pull-down device 380 of FIG. 7) that initializes the reference voltage to ground prior to coupling the reference voltage to a negative voltage (as discussed below in operations 730 and 740).

At operation 830, the reference voltage is coupled, with a first capacitive element, to a first negative voltage provided to the first set of bitlines based on the memory address information. For example, in referring to FIGS. 4 and 7, when NBL enable signal 114 transitions from '0' to '1' (e.g., from a logic low to a logic high value), circuit node 361 transitions from '1' to '0', thus capacitively coupling reference voltage 118 to a negative voltage with capacitive element 362. In some embodiments, the reference voltage is coupled to the first negative voltage after the pull-down device is deactivated.

At operation 840, the reference voltage is cumulatively coupled, with the first capacitive element and a second capacitive element, to a second negative voltage lower than the first negative voltage, where the second negative voltage is provided to the second set of bitlines based on the memory address information. For example, in referring to FIGS. 4 and 7, when NBL enable signal 114 transitions from '0' to '1' (e.g., from a logic low to a logic high value), circuit nodes 345 and 361 transition from '1' to '0', thus capacitively coupling reference voltage 118 to the second negative voltage with capacitive elements 346 and 362. In some embodiments, the reference voltage is cumulatively coupled to the second negative voltage after the pull-down device is deactivated.

As discussed above, the write assist circuits disclosed herein—e.g., write assist circuit 110 of FIG. 3 and write assist circuit 610 of FIG. 7—compensate for parasitic elements in bitlines, provide negative voltage tuning for different portions of an SRAM array, and compensate for process variations in the SRAM cell transistors. Further, with an auxiliary bitline topology (e.g., SRAM 680 of FIG. 6), the write assist circuit can provide a "more" negative voltage to memory cells located farther away from a write driver circuit (e.g., memory cells in the upper portion of SRAM array 680) without disturbing memory cells located closer to the write driver circuit (e.g., memory cells in the lower portion of SRAM array 680).

Embodiments of the present disclosure include a write assist circuit that includes a control circuit and a voltage generator. The control circuit is configured to receive memory address information associated with a memory write operation for one or more memory cells. The voltage generator is configured to provide a reference voltage to one or more bitlines coupled to the one or more memory cells. The voltage generator includes a first capacitive element and a second capacitive element. During the memory write operation, the first capacitive element is configured to couple the reference voltage to a first negative voltage. Based on the memory address information, the first and second capacitive elements are configured to cumulatively couple the reference voltage to a second negative voltage lower than the first negative voltage.

Embodiments of the present disclosure include a memory device. The memory device includes an array of memory cells, a write driver circuit, and a write assist circuit. The write driver circuit is configured to provide a reference voltage for a memory write operation performed on one or more memory cells in the array. The write assist circuit is configured to provide the reference voltage to the write driver circuit. The write assist circuit can include a control circuit and a voltage generator. The control circuit is configured to receive memory address information associated with the memory write operation performed on the one or more memory cells in the array. The voltage generator includes a first capacitive element and a second capacitive element. Based on the memory address information, the first and second capacitive elements are configured to cumulatively couple the reference voltage to a second negative voltage lower than the first negative voltage.

Embodiments of the present disclosure include a method for a memory write operation. The method includes the following operations: (i) receiving memory address information associated with the memory write operation for one or more memory cells; (ii) providing a reference voltage to one or more bitlines coupled to the one or more memory cells; (iii) coupling, with a first capacitive element, the reference voltage to a first negative voltage; and (iv)

cumulatively coupling, with the first capacitive element and a second capacitive element, the reference voltage to a second negative voltage lower than the first negative voltage based on the memory address information.

Embodiments of the present disclosure include another write assist circuit that includes a control circuit and a voltage generator. The control circuit is configured to receive memory address information associated with a memory write operation for one or more memory cells. The voltage generator is configured to provide a reference voltage to a first set of bitlines coupled to a first set of the one or more memory cells and a second set of bitlines coupled to a second set of the one or more memory cells. The voltage generator includes a first capacitive element and a second capacitive element. During the memory write operation, the first capacitive element is configured to couple the reference voltage to a first negative voltage provided to the first set of bitlines based on the memory address information. Based on the memory address information, the first and second capacitive elements are configured to cumulatively couple the reference voltage to a second negative voltage lower than the first negative voltage, where the second negative voltage is provided to the second set of bitlines.

Embodiments of the present disclosure include another memory device. The memory device includes an array of memory cells, a write driver, and a write assist circuit. The write driver circuit is configured to provide a reference voltage to a first set of bitlines coupled to a first set of memory cells in the array and a second set of bitlines coupled to a second set of memory cells in the array. The write assist circuit is configured to provide the reference voltage to the write driver circuit. The write assist circuit includes a control circuit and a voltage generator. The control circuit is configured to receive memory address information associated with a memory write operation performed on one or more memory cells in the array. The voltage generator includes a first capacitive element and a second capacitive element. During the memory write operation, the first capacitive element is configured to couple the reference voltage to a first negative voltage provided to the first set of bitlines based on the memory address information. Based on the memory address information, the first and second capacitive elements are configured to cumulatively couple the reference voltage to a second negative voltage lower than the first negative voltage, wherein the second negative voltage is provided to the second set of bitlines.

Embodiments of the present disclosure include another method for a memory write operation. The method includes the following operations: (i) receiving memory address information associated with the memory write operation for one or more memory cells in an array of memory cells; (ii) providing a reference voltage to a first set of bitlines coupled to a first of memory cells in the array and a second set of bitlines coupled to a second set of memory cells in the array; (iii) coupling, with a first capacitive element, the reference voltage to a first negative voltage provided to the first set of bitlines based on the memory address information; and (iv) cumulatively coupling, with the first capacitive element and a second capacitive element, the reference voltage to a second negative voltage lower than the first negative voltage, where the second negative voltage is provided to the second set of bitlines based on the memory address information.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first capacitive element;
a second capacitive element; and
a logic circuit configured to:
receive row address information associated with first memory cells in a first portion of a memory region and with second memory cells in a second portion of the memory region; and
control a reference voltage provided to first bitlines coupled to the first memory cells in the first portion of the memory region and second bitlines coupled to the second memory cells coupled to the second memory cells in the second portion of the memory region,
wherein the second bitlines are longer than the first bitlines,
wherein, in response to the row address information being associated with at least one of the first memory cells, the logic circuit is configured to couple, via the first capacitive element, the reference voltage to a first negative voltage applied to the first bitlines coupled to the first memory cells in the first portion of the memory region,
wherein, in response to the row address information being associated with at least one of the second memory cells, the logic circuit is configured to couple, via the first and second capacitive elements, the reference voltage to a second negative voltage lower than the first negative voltage, and
wherein the second negative voltage is applied to the second bitlines coupled to the second memory cells in the second portion of the memory region.

2. The circuit of claim 1, wherein the second memory region is located at a distance farther away from the logic circuit than that of the first memory region.

3. The circuit of claim 1, further comprising a pull-down transistor configured to initialize the reference voltage to ground.

4. The circuit of claim 3, wherein the first capacitive element is configured to couple the reference voltage to the first negative voltage after the pull-down transistor is deactivated.

5. The circuit of claim 3, wherein the first and second capacitive elements are configured to cumulatively couple the reference voltage to the second negative voltage after the pull-down transistor is deactivated.

6. The circuit of claim 1, wherein each of the first and second capacitive elements comprises a top capacitor plate coupled to a voltage potential and a bottom capacitor plate coupled to the reference voltage, and wherein the logic circuit is configured to control a transition of the voltage potential from a first value to a lower second value to cumulatively couple the reference voltage to the second negative voltage.

7. The circuit of claim 6, wherein the logic circuit is configured to control the transition of the voltage potential coupled to the top capacitor plate of the first and second capacitive elements based on the row address information.

8. A device, comprising:
   an array of memory cells that comprises:
   a lower portion with first memory cells having first bitlines; and
   an upper portion with second memory cells having second bitlines longer than the first bitlines;
   a write driver circuit configured to provide a reference voltage to the first and second memory cells via the first and second bitlines; and
   a voltage generator circuit, comprising:
   a first capacitive element;
   a second capacitive element; and
   a logic circuit configured to:
   receive first row address information and second row address information associated with the first memory cells and the second memory cells, respectively; and
   control a reference voltage provided to the first bitlines and the second bitlines,
   wherein based on the first row address information, the logic circuit is configured to couple, via the first capacitive element, the reference voltage to a first negative voltage applied to the first bitlines of the first memory cells in the lower portion of the array of memory cells,
   wherein based on the second row address information, the logic circuit is configured to couple, via the first and second capacitive elements, the reference voltage to a second negative voltage lower than the first negative voltage, and
   wherein the second negative voltage is applied to the second bitlines of the second memory cells in the upper portion of the array of memory cells.

9. The device of claim 8, further comprising a column multiplexer circuit comprising a first select transistor configured to access at least one of the first bitlines and a second select transistor configured to access at least one of the second bitlines, wherein gate terminals of the first and second select transistors are electrically coupled to one another.

10. The device of claim 9, wherein the lower portion of the array of memory cells is located closer to the column multiplexer than the upper portion of the array of memory cells.

11. The device of claim 8, wherein the lower portion of the array of memory cells is located closer to the write driver circuit than the upper portion of the array of memory cells.

12. The device of claim 8, wherein each memory cell in the array of memory cells comprises a static random access memory cell.

13. The device of claim 8, wherein the voltage generator circuit further comprises a pull-down transistor configured to initialize the reference voltage to ground.

14. The device of claim 13, wherein the first capacitive element is configured to couple the reference voltage to the first negative voltage after the pull-down transistor is deactivated.

15. The device of claim 13, wherein the first and second capacitive elements are configured to cumulatively couple the reference voltage to the second negative voltage after the pull-down transistor is deactivated.

16. The device of claim 8, wherein each of the first and second capacitive elements comprises a top capacitor plate coupled to a voltage potential and a bottom capacitor plate coupled to the reference voltage, and wherein the logic circuit is configured to control a transition of the voltage potential from a first value to a lower second value to cumulatively couple the reference voltage to the second negative voltage.

17. A method, comprising:
   receiving row address information associated with a first memory cell in a first portion of a memory array and a second memory cell in a second portion of the memory array;
   controlling a reference voltage provided to a first bitline electrically coupled to the first memory cell and a second bitline electrically coupled to the second memory cell, wherein the second bitline is longer than the first bitline;
   in response to the row address information being associated with the first memory cell, coupling the reference voltage to a first negative voltage with a first capacitive element, wherein the first negative voltage is applied to the first bitline coupled to the first memory cell in the first portion of the memory array; and
   in response to the row address information being associated with the second memory cell, coupling the reference voltage to a second negative voltage with the first capacitive element and a second capacitive element, wherein the second negative voltage is lower than the first negative voltage and is applied to the second bitline coupled to the second memory cell in the second portion of the memory array.

18. The method of claim 17, wherein controlling the reference voltage comprises initializing, with a pull-down transistor, the reference voltage to ground prior to coupling the reference voltage to the first and second negative voltages.

19. The method of claim 18, wherein coupling the reference voltage to the first negative voltage comprises coupling the reference voltage to the first negative voltage after the pull-down transistor is deactivated.

20. The method of claim 18, wherein coupling the reference voltage to the second negative voltage comprises cumulatively coupling the reference voltage to the second negative voltage after the pull-down transistor is deactivated.

* * * * *